United States Patent [19]

Konicek et al.

[11] Patent Number: 5,309,223
[45] Date of Patent: May 3, 1994

[54] LASER-BASED SEMICONDUCTOR LEAD MEASUREMENT SYSTEM

[75] Inventors: John P. Konicek, Minneapolis; Steven K. Case, St. Louis Park; Timothy A. Skunes, Columbia Heights; Jeffrey A. Jalkio, St. Paul, all of Minn.

[73] Assignee: CyberOptics Corporation, Minneapolis, Minn.

[21] Appl. No.: 719,727

[22] Filed: Jun. 25, 1991

[51] Int. Cl.⁵ .......................................... G01N 21/84
[52] U.S. Cl. ..................................... 356/375; 356/237
[58] Field of Search ............... 356/237, 386, 387, 375; 29/720, 721, 759

[56] References Cited

U.S. PATENT DOCUMENTS

| | | | |
|---|---|---|---|
| 3,636,635 | 1/1972 | Lemelson | 356/375 |
| 3,854,052 | 12/1974 | Asar et al. | 356/387 |
| 3,905,705 | 9/1975 | Petrohilos | 356/387 |
| 4,074,938 | 2/1978 | Taylor | 356/386 |
| 4,585,350 | 4/1986 | Pryer | 356/375 |
| 4,615,093 | 10/1986 | Tews et al. | |
| 4,812,666 | 3/1986 | Wistrand | 250/561 |
| 5,114,229 | 5/1992 | Hidoshima | 356/237 |
| 5,162,866 | 11/1992 | Tomiya et al. | 356/237 |

FOREIGN PATENT DOCUMENTS

| | | | |
|---|---|---|---|
| 2303751 | 12/1990 | Japan. | |
| 1370456 | 1/1988 | U.S.S.R. | 356/375 |
| 2183820 | 6/1987 | United Kingdom. | |

Primary Examiner—Richard A. Rosenberger
Attorney, Agent, or Firm—Dorsey & Whitney

[57] ABSTRACT

A high speed, high precision laser-based semiconductor lead measurement system for use on surface mount component placement machines. A laser system is used to accurately sense the position and condition of each of the many leads used on integrated circuits prior to their placement on a surface mount circuit board by a pick and place machine. Using one, two or three laser beams, the non-contact sensor system can, with the highest degree of resolution, determine lateral orientation and coplanarity of leads for integrated circuit components, even those having an ultra-fine pitch. Determination of the lead position by the invention is based on the integrated circuit leads occluding the light of one or more precisely directed and focused laser light sources. Each integrated circuit lead is passed through the focal point of a laser beam. The position of each lead is determined when it blocks all or a portion of the light of the laser beam. A processor means is used to calculate the actual position of each lead. The difference between the actual position of the lead and the nominal position of the lead can then be computed. The position of each lead is then sorted to determine the greatest deviation of any lead from a best fit plane. The processor may then either generate a reject or a repositioning signal to the component placement machine for proper placement of the integrated circuit upon the surface mount circuit board.

49 Claims, 9 Drawing Sheets

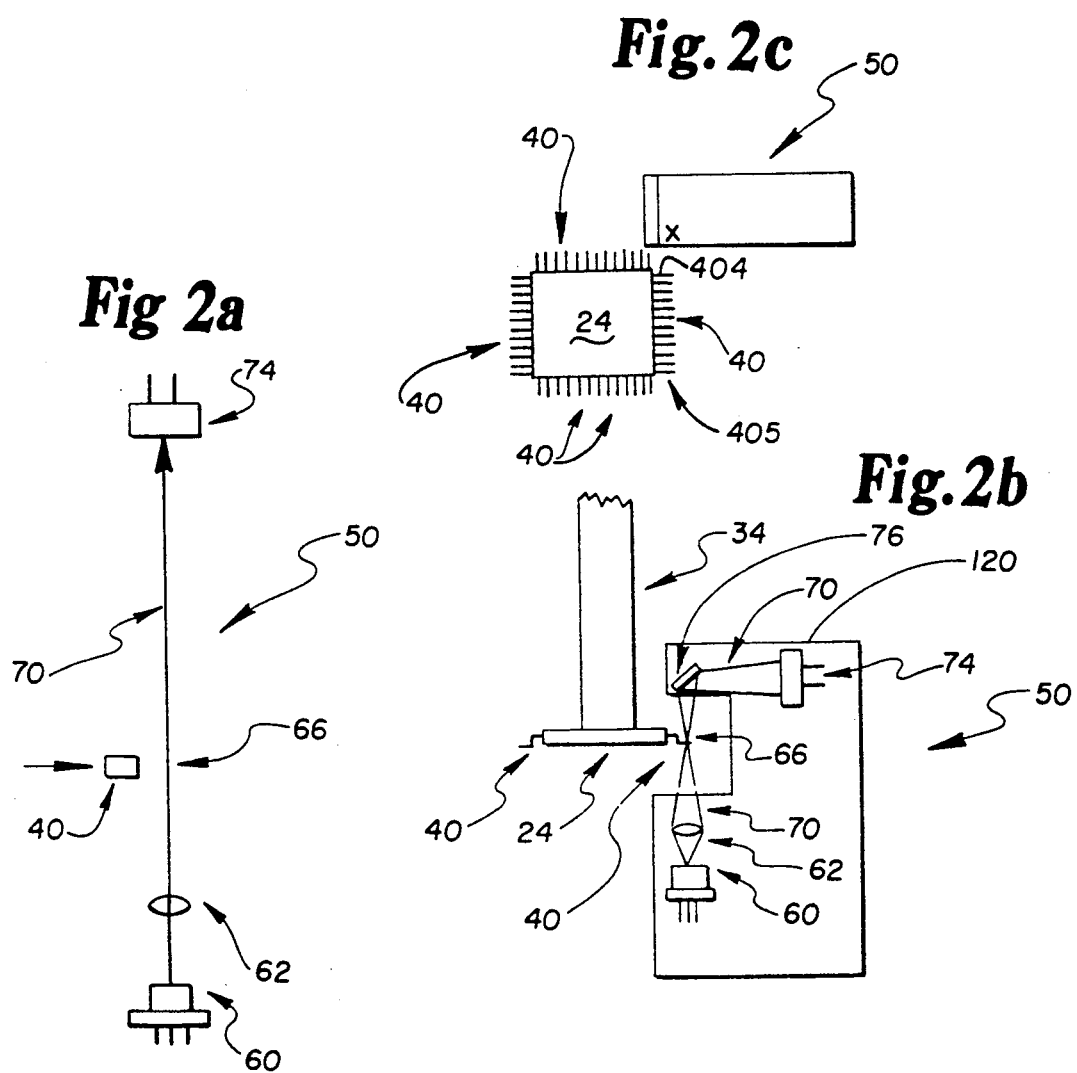

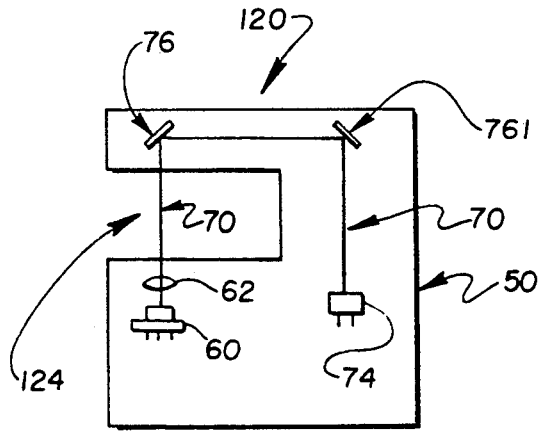
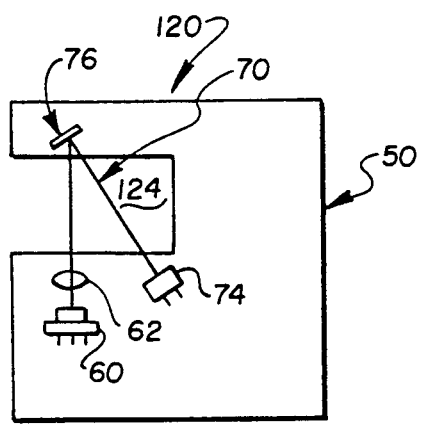
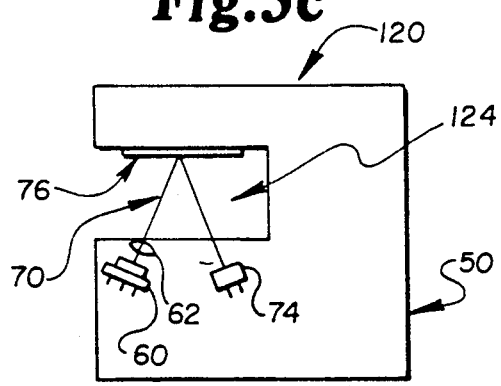
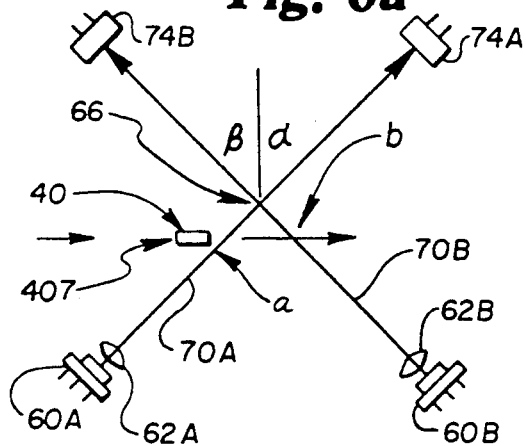
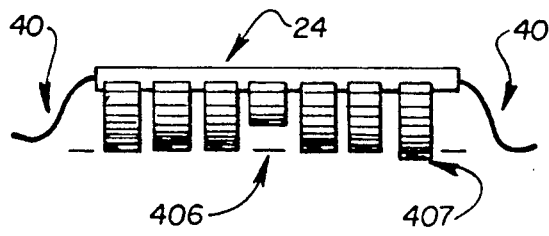

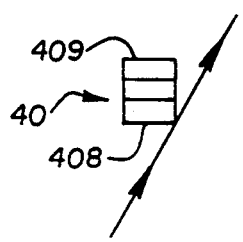
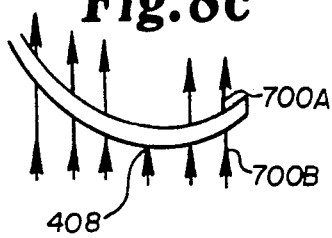
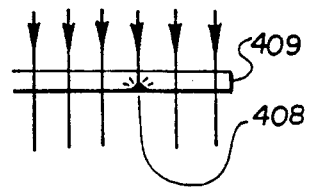
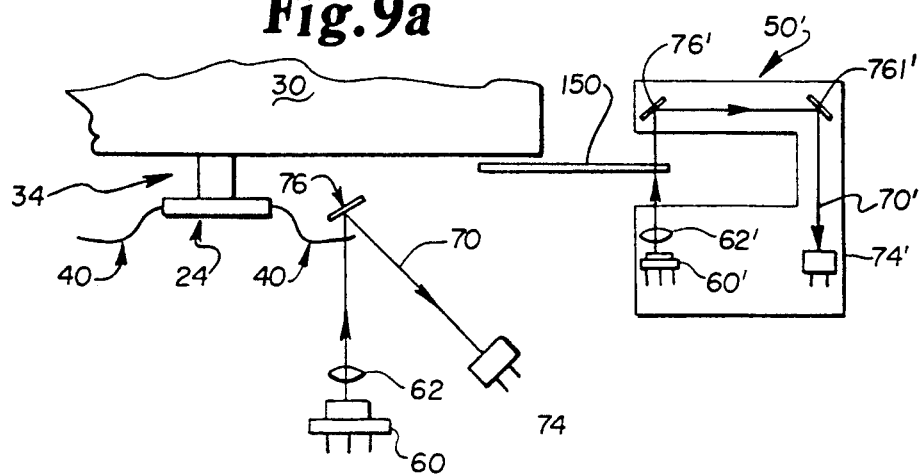
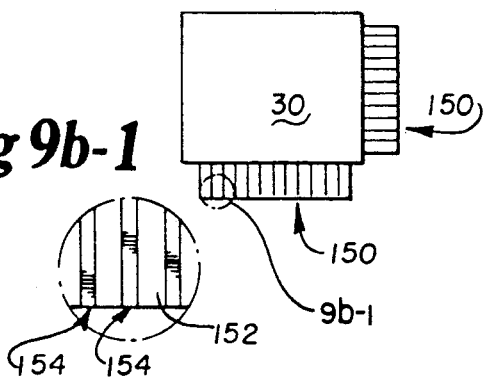
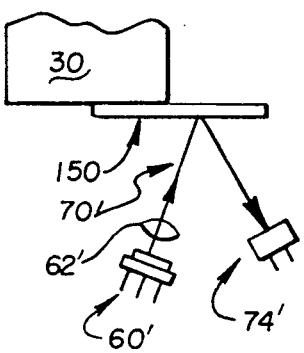

LASER-BASED SEMICONDUCTOR LEAD MEASUREMENT SYSTEM

BACKGROUND OF THE INVENTION

The invention relates to vision systems for accurately sensing the position and condition of leads used on integrated circuits prior to placement of the integrated circuit on a circuit board by a surface mount pick and place machine. More particularly, the invention relates to a non-contact laser-based sensor system which can, with the highest degree of resolution, determine lateral orientation and coplanarity of leads for all such integrated circuit components, even those having an ultra-fine pitch.

As electronic devices get smaller and smaller, and yet more complex, electronic components which are connected together to achieve the electronic functions of such devices are also decreasing in size. Additionally, many functions are being incorporated in single unitary monolithic integrated circuits. These integrated circuit components, which are also called semiconductor packages or chips, have a number of leads or elements providing electrical connections. As a consequence of their small size, integrated circuits are created in a configuration referred to as quad flat packs (QFPs) or quad packs with closely spaced leads emanating from each side of the quad pack. QFPs are particularly configured for surface mount placement with special leads which are referred to as gull wings. The QFPs are precisely placed by a pick and place machine upon the surface of a circuit board with the gull wing leads making proper contact with the circuit connections or pads which are subscribed on the circuit board or work piece. Similarly, more and more manufacturers are creating integrated circuits with even more delicate lead structured on tape, which is used in a process called tape automated bonding (TAB).

The separation between the centers of any pair of adjacent leads on such components is referred to as the pitch. Currently, a commonly manufactured component separation is 25 mil pitch, the center of each lead spaced at 25 thousandths of an inch intervals. However, advances in component manufacturing technology have produced integrated circuits having 15 and 10 mil pitches and TAB components have been created having several hundred leads spaced with a 4 mil pitch.

For automated manufacturing of electronic devices using these micro-electronic components, the highest degree of accuracy in positioning and placing such components is required. To perform this delicate task, precision surface mount component placement machines have been developed.

There are two types of component placement machines in common use today. One of which is a cartesian system where one or more vacuum quills are used to travel to a bin, pick up a component, properly orient the component and carry it to a circuit board or other work piece to precisely place the component in its proper location. The proper location is the one where the leads make proper contact with the circuit connections which are subscribed on the circuit board or work piece. Another type of placement system in use is a carousel or turret placement system where components are picked up from the bin and stepped through stations located around the perimeter of a circular component carrying mechanism for placement on the circuit board. The components are not aligned in the component bins. Typically, gull wing type components may be out of position by plus or minus 50 mils and plus or minus 5 degrees angular orientation. Therefore, the orientation of components from bins must be determined prior to placement. The present invention is useful with both types of systems which must accurately place components with the highest degree of speed and accuracy.

Surface mount circuit boards have a number of small individual pads. Each lead from each electrical component must be placed precisely on one circuit board pad, to ensure proper electrical contact, thus requiring correct angular orientation and lateral positioning of the component. The dimensions of components to be placed normally vary between 0.02 inch and 2.0 inches.

In a surface mount component placement machine, a transport arm picks up the component from a component bin utilizing a vacuum quill as the primary instrument which gently picks up the component to be placed and transports it between the component bins and the circuit board. The transport arm moves the component from the bin to the circuit board located on a work table. During transport, the angular orientation of the component and the offset of the component from the center of the quill are determined. The condition of the leads is also checked to determine whether any are bent or skewed. Any necessary corrections in placement are then calculated and the placement head is adjusted to accommodate the corrections. The vacuum quill is then precisely lowered to fit the component on the circuit board. In current component placement machines, the transport arm and quill move at approximately one meter per second. At this speed, it is difficult for current systems to handle the fine pitch and range of components that must be placed and to achieve the accuracy required for alignment.

For quality manufacturing, component leads must be placed with at least 80% overlap of lead onto the corresponding pad of the circuit board. A device having a 20 mil pitch generally has 10 mil wide leads. With an 80% overlap, at least 8 mils of the lead width must be on the pad with no more than 2 mils of the lead width off the pad. In general, sensing systems used to align parts for placement must have five to ten times better resolution than the accuracy required. Therefore, 0.2 to 0.4 mil image resolution is required to achieve the maximum placement error of 2 mils specified for quality manufacturing methods.

Conventional vision systems used in conjunction with component placement machines for lead determination use a solid state television camera having a resolution of 512×512 picture elements or pixels. A two inch part and a corresponding two inch field of view with 512 elements produces a basic resolution of 4 mils or 4 thousandths of an inch. This is not a sufficient resolution and, in fact, as pointed out above, it is necessary to achieve a resolution which is at least an order of magnitude greater. One solution that has been suggested is the use of multiple lenses. Using different lenses to achieve the requisite magnification provides multiple fields of view. However, changes in the lens system consumes time, slowing the placement process and, thus, trades speed for accuracy.

Another solution that has been proposed is the use of super-resolution. With backlighting, a shadow is cast on the solid state pixel elements of a detector array and, by applying gray scale image processing algorithms to the intensity information of shadow edges cast upon the detector array, a super-resolution can be achieved which is approximately four times the resolution that can be achieved with binary processing.

Yet another solution proposed is a two-dimensional detector array having as many as 2,000×2,000 elements. Such a product is manufactured by Eastman Kodak of Rochester, N.Y. However, this solution is prohibitively expensive.

Finally, the use of linear arrays having 1,000-2,000 detector elements is also possible. Using such a system, the motion of the part is synchronized with continuously read successive frames from the array to build up a two-dimensional image. With super-resolution, an accuracy of resolution is achieved equivalent to that needed for a 20 mil pitch device.

What is needed is an economical system which can accurately locate leads having 15, 10, and even 4 mil pitch. These systems must have an accuracy of resolution in the range of at least 0.02 mils. The present invention is addressed to fulfill these needs.

SUMMARY OF THE INVENTION

The present invention is a laser-based sensor system which in its basic embodiment can detect the lateral position of leads from an integrated circuit (IC) array with a resolution of 0.02 mils. A single focused laser light source is utilized through the focal point of which the leads are passed. The amount of light not blocked is sensed by a detector. Each time the beam is initially blocked by a lead, the quill position encoder is read to establish a leading edge position of each lead. Similarly, when the detector again detects the laser beam, the quill position encoder is read to establish the trailing edge of each lead. The positions are averaged to locate the actual physical center of each lead. And, when compared to the nominal center, where the center should normally be, the deviation of each lead can be processed to determine the most accurate placement by the component placement machine. The leads on each side pass through at a high speed. For the simplest and lowest cost system, a component could be rotated and passed through the same sensor four times to read all four sides of the component. A higher speed is possible by using two, three or four sensors in series. To accommodate varying package sizes, a component library is stored electronically and is utilized in jogging the component part laterally by the placement head to pass the component leads through the laser focal point on each sensor.

Advantages of this system include ultra-high speed, the ability to gather data only where needed (on the leads themselves), ultra-high resolution and expandability to arbitrary part sizes. Using a two laser beam system, a coplanarity measurement also can be achieved to determine vertical displacement (height) of any lead. The coplanarity measurement is a measurement of the deviation of the leads from lying in a single best fit plane. The coplanarity measurement provides an indication of how well the components will sit and form electrical contacts on the circuit board. For the highest accuracies required, a three laser system can be utilized to accommodate the minute variations in lead cross section. Finally, a multiple laser system using stripes or sheets of laser light can be used for coplanarity and to detect deviations in the horizontal plane of the lower surfaces of the lead for purposes of assuring accurate contact with the circuit pads upon which the component is placed. An additional sensor system of substantially identical design is also disclosed to accurately and dynamically sense the relative position between the placement head and the component.

It is an object of the invention to analyze the leads on an integrated circuit component to determine if any of the leads are bent.

It is an object of the invention to sense the lateral lead position of each lead on an integrated circuit and to determine whether any lead position deviates from its nominal position.

It is an object of the invention to check coplanarity of the leads on an integrated circuit component.

It is an object of the invention to check the lateral position and coplanarity of leads on an integrated circuit component with a high degree of accuracy.

It is an object of the invention to analyze the lateral position and coplanarity of the leads on an integrated circuit component with a high degree of resolution.

It is an object of the invention to check the lead positions on integrated circuit lead frames having a 4 mil pitch.

It is an object of the invention to check the lead positions on an integrated circuit component with a resolution of better than 1 micron.

These and other objects and advantages of the invention will become obvious to those skilled in the art upon review of the following description, the attached drawings and the appended claims.

DESCRIPTION OF THE DRAWINGS

FIG. 2, comprising FIGS. 2a-2c, shows a preferred embodiment of the invention. FIG. 2a is a representation of basic elements of the invention. FIGS. 2b and 2c represent a side view and top view of the mechanical structure of one embodiment of the invention.

FIG. 5, consisting of FIGS. 5a-5c, illustrates alternative physical embodiments, each designed to minimize the physical intrusion of parts of the invention between the placement head of the component placement machine and the component whose leads are being analyzed.

FIG. 6a illustrates a two-laser beam configuration which can be used to analyze coplanarity with a high degree of resolution. FIG. 6b illustrates a semiconductor chip with one lead above the horizontal plane of the leads and second lead below that plane.

FIG. 9, consisting of FIGS. 9a-9c, illustrates use of the invention to dynamically determine the position of the placement head on the component placement machine. With this embodiment of the invention, the precise location of both the optical target of the placement head and the component leads are simultaneously determined. The focused laser beam can pass through the optical target as illustrated in FIG. 9a or can be reflected from the optical target as illustrated in FIG. 9c.

DESCRIPTION OF PREFERRED EMBODIMENTS

It is an object of current manufacturers of electronic products, such as audio and video devices and computer systems, to package such products in as small a package or area as is possible using current technology. To achieve this objective, and to economically manufacture such electronic devices, it has also been necessary to automate the manufacturing process. As a consequence, surface mount electronics have been developed. Surface mounted electronic components 24 are placed on circuit boards 28 specially designed to receive them using pick and place machines. It is imperative with such automated manufacturing for quality control and, in order to create an operable device, that each component 24 be precisely placed in its proper position on the circuit board 28.

Figure 1:
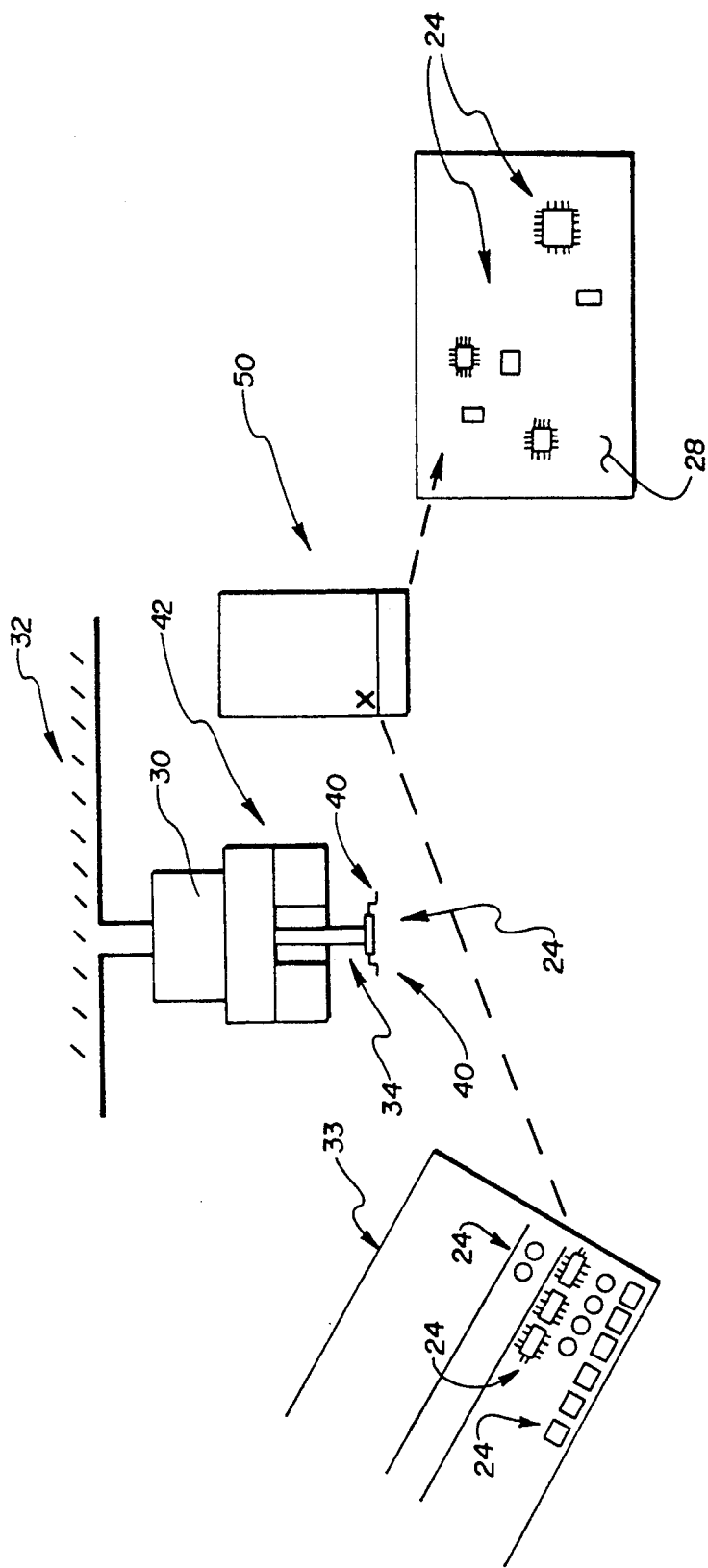
FIG. 1 represents a component placement system utilizing the present invention. Components are picked up from a source tray by the placement head and associated vacuum quill. The component is preferably positioned in the correct angular orientation on the vacuum quill and then passed through one or more sensors constructed in accordance with the present invention. Thereafter, the component is precisely placed by the component placement machine on a circuit board adapted to receive the component.

FIG. 1 shows a typical component placement machine system where a placement head 30 is suspended and driven from a rail 32, picks up an electronic component 24 to be placed with a vacuum quill 34 and, with as much speed as possible, transports the component 24 to the circuit board 25 and precisely places the electronic component 24 in the proper location with its leads 40 precisely placed on the corresponding circuit pads or lines on the circuit board 28. Co-pending U.S. patent application Ser. No. 07/659,983, filed Feb. 22, 1991, entitled A High Precision Component Alignment Sensor System, discloses a non-contact laser-based alignment sensor 42 which is carried on the placement head 30 and is utilized to generate the correct angular orientation in the X-Y plane of the component 24 for placement and also determines electronically any offset of the center of the component 24 with the center of the vacuum quill 34 which carries the component 24 to the circuit board 28. The disclosure is incorporated herein by reference.

This high speed laser-based system 42 of the prior invention utilizes a stripe of laser light (not shown) which passes by and is blocked by the component 24 whose alignment is being sensed. The shadow cast by the component 24 is detected by a linear array detector (not shown) whose data is analyzed to detect the leading edge and the trailing edge of the shadow. This shadow edge detection information is analyzed to achieve an angular orientation of the component 24 and lateral alignment. Although angular orientation can be achieved with an accuracy of better than 0.03 degrees and lateral positioning can be achieved to an accuracy of better than 0.001 inches, the system is not designed to precisely locate each of the leads 40 of the component 24.

The prior sensor system 42 is suitable for leadless components 24 and all other components 24, including the components 24 which are sensed and placed with the use of the present invention 50. That sensor system 42 and the sensor system 50 of the present invention are suitable for handling all electronic component 24 sizes with which a surface mount component pick and place machine is conventionally used. Normally these electronic components 24 range in size between 0.02 inch and 2.0 inches, although even larger sizes can be accommodated.

It is normally the largest components 24 that are most difficult to accurately place. The larger components 24 tend to be integrated circuits with many delicate leads 40. These are the most expensive components 24, costing on the average of $100-$500. In addition, to assure compactness, for monolithic integrated circuits 24, lead 40 size and lead 40 spacing have been constantly shrinking. Current components 24 having a 25 mil pitch, or a spacing between leads of 0.025 inch, are common on quad flat pack components. However, components 24 with spacing of between 0.004 to 0.020 inches (4-20 mils) are beginning to appear on the market. These components 24 have hundreds of leads 40, each of which must be accurately placed upon and bonded to a corresponding pad or circuit line on the circuit board 28. For the smallest components 24, the spacing required is approximately the same as the diameter of a human hair. The accuracy of resolution to achieve such placement must be an order of magnitude greater than the maximum error permitted in placing such components 24.

A number of embodiments 50 are disclosed and claimed herein which provide solutions to problems which occur or potentially occur in the precise placement of the leads 40 of an integrated circuit 24, or other semiconductor devices 24, on a corresponding circuit board 28 with a pick and place machine. Each of the embodiments 50 is specifically designed to accurately locate the leads 40 on a semiconductor device 24 and to provide signals to the placement machine to most accurately place the component 24 if it can be placed within the design rules for the component 24, or to reject the component 24 if the sensor 50 determines that a possible short circuit or open circuit might occur because one or more leads 40 are bent in the vertical or horizontal plane of the leads 40.

Referring again to FIG. 1, a station 50 is shown having one or more laser-based sensors constructed in accordance with the teaching of this invention. As depicted in FIG. 1, the leads 40 of the component can be passed through the laser beam(s) 70 which are part of the invention 50 to analyze the lateral position and/or coplanarity of each of the leads 40. It will be understood by those skilled in the art that the motion of the leads 40 through the focal point 66 of the laser beam(s) 70 is relational and that the component 24 can be brought to a standstill and stabilized at the sensor station 50 and the sensor 50 moved by the leads 40 on a translation table (not shown) or the like. It will also be understood that both the sensors 50 and component 24 may be in motion simultaneously during the measurement.

FIG. 2 shows in FIG. 2a a representation of the basic components of the laser sensor 50 and, in FIGS. 2b and 2c a side view and top view of one physical configuration of the invention 50. The configuration includes a single light source 60, a laser diode, which is focused through a focusing lens 62 so that the focal point 66 of the laser beam 70, which is approximately 1 mil in diameter, is focused on the plane of the leads 40 passing through the sensor system 50. When the laser beam 70 is not blocked by the lead 40 being sensed, the laser beam 70 strikes a single detector 74.

While a single laser beam 70 is illustrated in FIG. 2a, it should be understood to represent, in this and subsequent drawings, a focused laser beam 70 as illustrated in FIG. 2b, the beam having approximately a one mil focal point 66 located at the nominal plane of the leads 40 being analyzed with a depth of focus of about 20 mils. Also, while the detector 74 is shown in FIG. 1a to be a direct, uninterrupted line of sight of the laser source, in practice the laser beam 70 is preferably folded with the use of mirrors 76, lenses or prisms (not shown) so as to provide minimum intrusion above the component 24 for reasons to be discussed below. Since a single light source 60 is used with a control circuit 90 (shown in FIG. 4) to keep the laser power constant, constant illumination is assured. With a single detector 74 being utilized, uniformity of response from the detector 74 is assured. There are no pixel-to-pixel variations as are common in other proposed solutions. While it also is possible to use a focused laser beam as a distance sensor to detect the leads 40, such an embodiment is subject to lead surface microstructure problems, nicks and scratches in the lead surface. Using the embodiment shown, the laser beam 70 is used as a backlighting source to cast a detectable shadow on the detector 74 which eliminates the potential of surface microstructure problems. Finally, by using a laser beam 70 focused directly on the leads 40 themselves, maximum utilization of data is possible, since all data corresponds to lead structure and it is not necessary to consider or reject data relating to the environment surrounding the chip 24 or the plastic packaging of the device 24 as is common in currently utilized solid state TV systems.

Figure 3A:
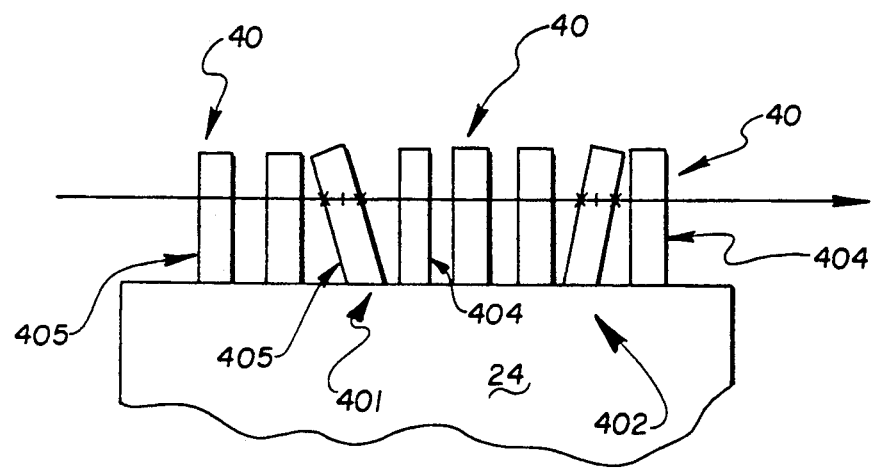
FIG. 3, consisting of FIGS. 3a-3b, shows, in FIG. 3a, a semiconductor package having bent leads in the lateral plane and, in FIG. 3b, an illustration of placement of leads which only partially overlap corresponding circuit connection pads.
Figure 3B:
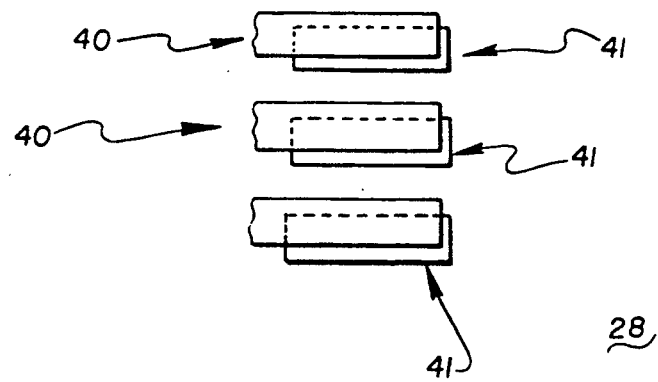

Multiple lead integrated circuit chips 24 are generally releasably but adhesively held on a strip of tape or the like, in the source tray 33. Therefore, generally, the leads 40 on the IC chip 24 have good coplanarity, that is, the lowest surface of the leads 40 are generally in the same plane. However, during packaging, shipping and loading into the source tray 33, it is possible for the leads 40 to get slightly bent or skewed so that all leads 40 are not always parallel for purposes of placement on the circuit board pads. FIG. 3a generally illustrates a component 24 having leads 40, two of which 401, 402 are bent, one 401 with a negative deviation, it trails its nominal position, and one 402 with a positive deviation. It is a general design rule of quality assurance that at least 80% of each lead 40 must be accurately placed on the circuit pad 41 which has been created to receive the lead 40. This placement is illustrated in FIG. 3b. As the shadow of the lead 40 is cast upon the detector 74, data is stored which accurately represents the leading edge 404 and trailing edge 405 of each lead 40 on the IC chip 24.

A processor means (94 shown in FIG. 4) is then used to average the detected position of the leading edge 404 and trailing edge 405 of each of the leads 40 to find the center of each of the leads 40. The difference between the measured center of the lead 40 and the nominal position for the lead 40 is then computed. The position of each of the leads 40 is then sorted by the deviation of that lead 40 from its nominal position.

Finally, the most negative deviation and the most positive deviation are averaged to get the recommended adjustment for purposes of placement of the leads 40 on the receiving pads 41 on the circuit board 28. If the adjustment cannot be made within the 80% design rule discussed above, a rejection signal can be generated and the part 24 is rejected for return to the manufacturer. In addition, one can adjust the orientation and orthogonal placement of the part.

Figure 4:
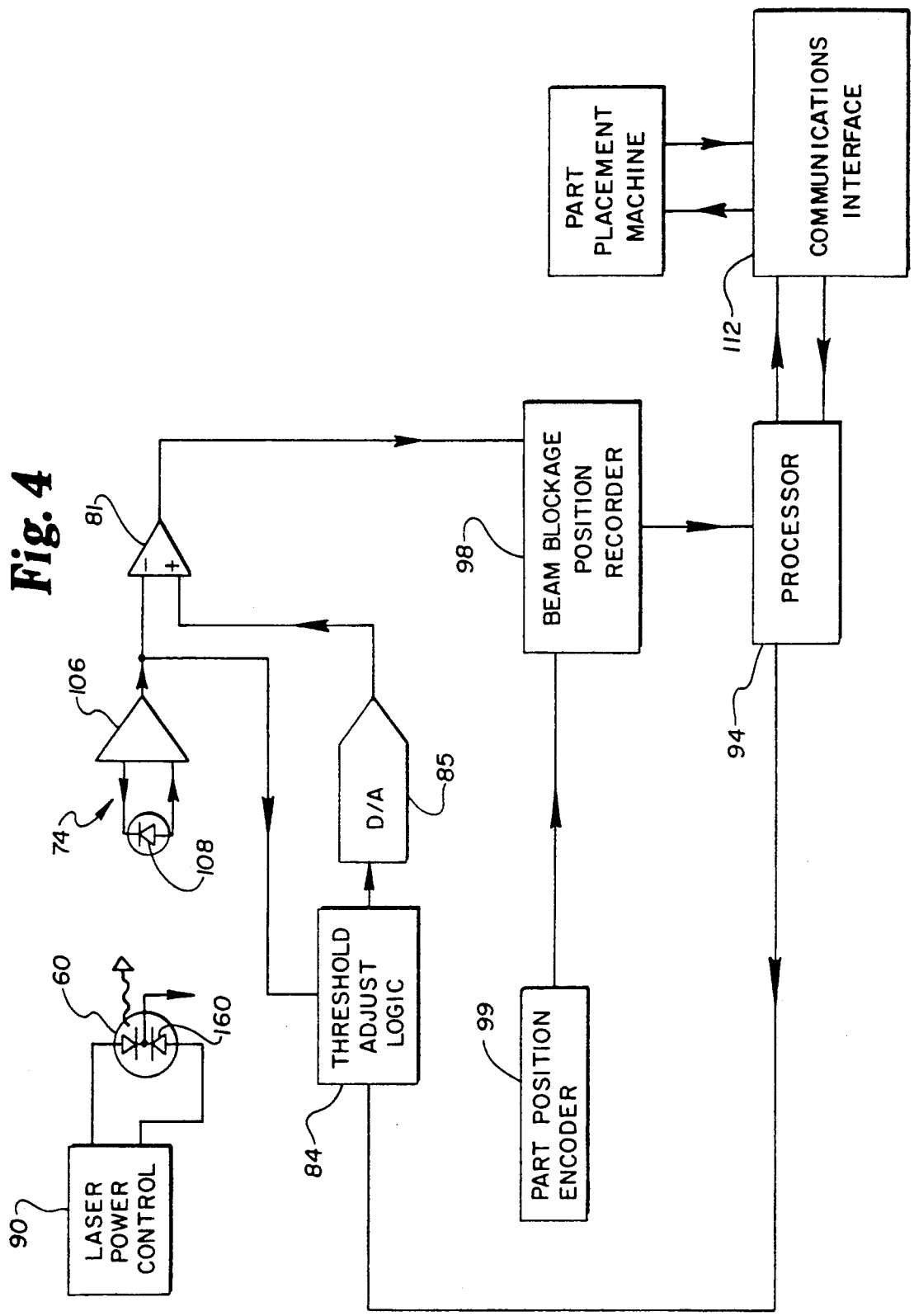
FIG. 4 is a schematic diagram of the sensor electronics.
Figure 7A:
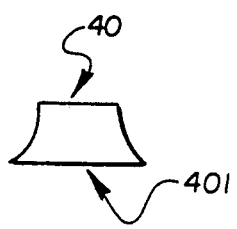
FIG. 7, consisting of FIGS. 7a-7d, illustrates a three laser beam system which is particularly suitable for analyzing the lower surface of leads such as those used in tape automated bonding.
Figure 7B:
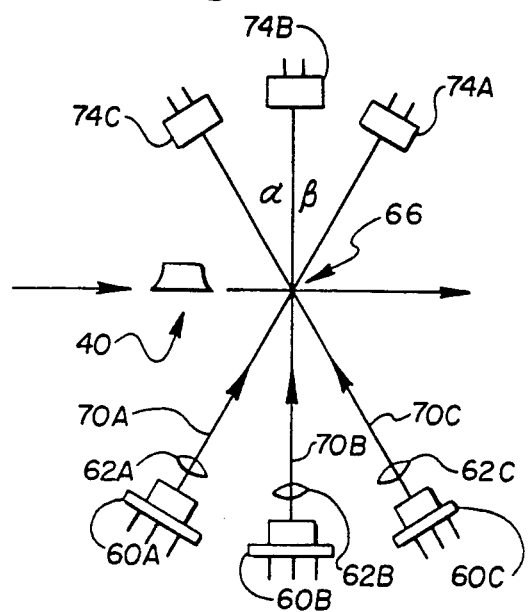
Figure 7D:
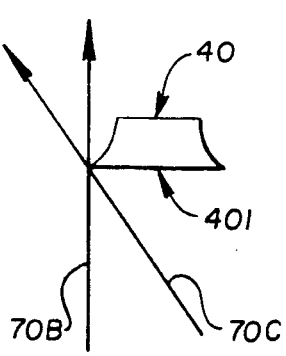
Figure 7E:
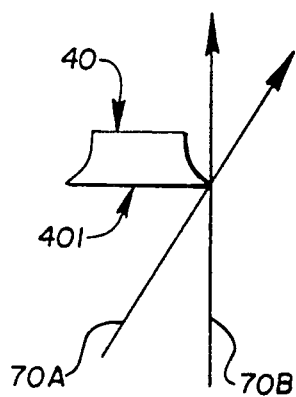

The electronic circuitry utilized in the inventon is illustrated in schematic form in FIG. 4. Determination of the lead positions 40 by the lead locator measurement and detection instrument 50 is based on the IC leads 40 occluding the light of the precisely directed and focused laser light source 60. Each IC lead 40 is passed through the focal point 66 of the directed and focused laser beam 70. The position of each lead 40 is determined when it blocks all or a portion of the light of the laser beam 70. The diameter of the laser beam 70 at the focal point 66 is typically 0.001 inch, allowing for a highly accurate indication of when the lead 40 enters and exits the beam 70.

Blockage of the laser beam 70 is determined by monitoring the output of the light sensitive detector 74 and performing a comparison with a reference voltage. When each edge 404, 405 of each IC lead 40 is detected, the position of the vacuum quill 34 is recorded. Then, the processor 94 via the communications interface 112 provides outputs to the component placement machine for the purpose of determining the position that the leads 40 on the component 24 should be placed on the work piece 28.

The electronic circuitry of the lead locator instrument 50, includes the detector 74 and comparator 81. The detector 74 provides a voltage output level, corresponding to the amount of light impinging on the detector 74, to the comparator 81 via an amplifier 106. The output voltage of the detector 74 is accordingly inversely related to the amount of blockage of the laser beam 70. The comparator 81 compares the detector output voltage to a stepped reference voltage controlled by the threshold adjustment logic 84 and digital to analog converter 85, thereby providing a digital output measurement of beam blockage. The beam blockage signal from the comparator 81 has two states, beam blocked and beam not blocked.

The threshold adjust logic 84 drives a digital-to-analog (D/A) converter 85 to provide the stepped reference voltage to the comparator 81, and includes calibration logic for automatically adjusting the reference voltage applied to comparator 81 to compensate for occlusion of the laser beam 70 due to dust in the optical path of laser beam 70, as well as providing compensation for long term laser power drift. Outputs from the threshold adjust logic 84 are provided through D/A converter 85 for input to the comparator 81.

A threshold adjust logic 84 sequence is initiated for each component. During the threshold adjust logic 84 sequence, the output voltage of the detector 74 when illuminated by the unblocked laser 70 is determined. Then a threshold voltage is calculated by taking a selected percentage of the unblocked detector 74 voltage output, for example fifty percent. The threshold value so established is used to determine when a percentage of the laser beam 70 is occluded by a lead 40 during the lead locator 50 operation. Accordingly, "beam blockage" is determined by the comparator 81 when the amount of light detected by the detector 74 is a desired percentage of the amount of light 70 impinging on the detector 74 when the leads 40 are totally clear of the laser beam 70. Since the threshold logic sequence is performed prior to the measurement of leads 40 for each component 24, the output level of the detector 74 is re-established for each component.

The decision logic of the electronic circuitry is based around the processor 94. Inputs to the processor 94 include the beam blockage position received from the beam blockage position recorder 98 relating to the instantaneous position of the quill 34 from the component placement machine encoder 99. Beam blockage position information is recorded each time the beam blockage signal changes state. Alternatively, dynamic signals 98 for more accurately locating the position of the component 24 and its leads 40 can be generated using the embodiment of the invention 50 described in connection with FIG. 9. If the component is stationary and the laser is providing the relative motion, the position of the laser beam must be recorded. The processor 94, through a communications interface 112 to the component placement machine, can be adapted to perform the computations described in connection with the various embodiments of the invention 50 in connection with FIGS. 2-10. The processor 94 can be programmed to compute lead position, lead height, lead width, coplanarity, rejection equations, repositioning equations, statistical information and a variety of other related information. Also preferably contained within the processor unit 94 is a component 24 library of the components 24 in the component tray and sufficient information, as described to compute the component 24 offset for purposes of placement of the component 24 on the circuit board 28. The output of the processor 94 is provided to the control module of the component placement machine through the communications interface 112 so that the component can be precisely positioned. It will be obvious to one skilled in the art that numerous hardware and software possibilities exist for the processor 94 and communications interface 112 to the part placement machine.

The laser control circuit 90 employs a photo diode 160 packaged with a laser diode 60. The photo diode 160 monitors the optical intensity of the laser diode 60 to maintain a constant optical power output from the laser power control circuit 90.

The detector 74 includes a transimpedance amplifier 106 which generates a voltage proportional to the amount of light falling on the photo diode 108 of the detector 74. The comparator 81 receives the output of the amplifier 106 of the detector 74, and compares the detector output to the reference voltage supplied by the output of D/A converter 85. The D/A converter 85 receives its digital input from the threshold adjustment logic and applies the reference voltage to comparator 81.

The repeatability and accuracy of this invention are affected primarily by three factors: first, the ability to precisely control laser power output intensity, second, the detector's electronic signal to noise ratio, and third, the diameter of the focused laser beam. The invention's ability to precisely detect an edge or accurately detect when half a beam is blocked is heavily influenced by changing these three factors. Thus, when necessary, the laser power control circuitry 90 can be improved upon to more precisely control and maintain a constant laser power output intensity. Also, the detectors electronic signal to noise ratio may be improved by refining the detector circuitry. Although, the diameter of the focused laser beam 70 may be decreased in size to enhance performance of the invention, this involves an engineering trade-off negatively effecting the length of the laser beam's depth of focus. As the diameter of the laser beam 70 is decreased the precision of the device increases however, the corresponding decrease in depth of focus negatively affects the repeatability of the sensor measurements. A small depth of focus may allow some leads to pass outside the best focused area of the laser beam. The preferred beam diameter and depth of focus are approximately 1.3 mils and $+/-25$ mils respectively. Using the preferred diameter and depth of focus, the preferred embodiments repeatability is 0.02 mils. This performance can be improved by changing the three factors as stated above.

One embodiment of the present invention was tested and determined to have a resolution accuracy of 0.7 microns. Since there are 25 microns per mil or thousandths of an inch, the invention demonstrates about 25 times higher resolution than available vision systems in use today.

While the representation of the laser-based lead locator 50 in the lateral plane is represented in FIG. 2a with the detector 74 in a direct line of site of the lead 40, the focusing lens 62 and the laser diode 60, in actual practice, preferred embodiments are used which fold the laser beam 70 to accommodate the physical structure of the component placement machine. For accuracy of placement and to minimize vibration and deformation due to acceleration, it is desired to keep the length of the vacuum quill 34 on a component placement machine as short as possible. Therefore, it is necessary to keep the detecting arm 120 of the sensor 50 as thin or as narrow as possible so that it fits between the component 24 and the placement head 30 and so that it does not come in contact with or otherwise obstruct the placement head 30. As a consequence, a number of physical embodiments are illustrated in FIG. 2b and FIGS. 5a through 5c which permit an adequate focal length, but minimize the physical dimension of the sensing arm 120. As shown in FIG. 2b, a single reflecting mirror 76 is shown which folds the laser beam 70 onto the detector 74. As shown in FIG. 5a, two reflecting mirrors 76, 761 are utilized and the detector 74 can be located in the lower housing of the sensor 50. As shown in FIG. 5b, the sensor cavity 124 can be constructed with a depth so that the detector 74 can be accurately placed in an aperture bored into the sensor 50 housing to receive the occluded or passed laser beam 70. Finally, as shown in FIG. 5c, both the originating laser beam and the reflected laser beam can be located in suitably bored holes in the sensor housing with a flat horizontal mirror 76 interposed to reflect the laser beam 70. In a precisely constructed component placement machine, the mirror 76 of FIG. 5c can be adhered or otherwise fixed to the bottom surface of the placement head 30, or an alignment sensor 42, to provide a minimum intrusion into the space between the placement head 30 and the component 24.

Shown in FIG. 6 is an alternative embodiment of the present invention 50 which can be utilized to check both lateral displacement of any bent lead 40, as well as coplanarity. In most applications, not only is the lateral position of the leads important, but also the height of the leads. FIG. 6b illustrates a chip 24 having generally planar leads 40 but having one lead 406 bent up away from the plane of the other leads 40, and another 407 extending below the plane of the other leads 40.

A common method of manufacturing to connect the leads 40 to the circuit board 28 includes the use of a stencil on top of the circuit board 28. Solder paste is applied to the pads 41 on the circuit board 28 through the stencil. After the integrated circuits 24 are accurately placed on the solder paste, the circuit board 28 is baked in an oven. When baked, the solder melts and the component 24 is then electrically and mechanically attached to the board 28. Typically, solder paste is approximately 8 thousandths of an inch thick when applied. When it melts, it is approximately 4 mils or 4 thousandths of an inch thick. If one or more of the leads 40 are bent above or below the nominal plane of the other leads by more than 4 thousandths of an inch, they will not connect through the solder paste to the circuit board 28 and the result is an open circuit. Thus, a coplanarity measurement is important to assure that all the lowest surfaces of all the leads 40 are in the same horizontal plane to avoid an electronically defective circuit.

To measure coplanarity, two laser beams 70A and 70B having substantially the same configuration as previously discussed are used and are separated by a given angle. The preferred angular separation of the two beams can be determined taking two factors into account. Increasing the angular separation provides more resolution and accuracy in the height measurement, but the angular separation must be small enough for the beams to pass unobstructed through the finest pitch parts including parts which have adjacent lead coplanarity errors of up to 0.005 inches. From these two factors, a separation of approximately 30 degrees was determined to be a preferred angle. Therefore, it is generally preferable to have the beams 70A, 70B angled at about 20–30 degrees from vertical or with an included angle $\alpha$ plus $\beta$ of approximately 40–60 degrees. The focal point 66 of each of the beams 70A, 70B is preferably at the intersection point, which is the nominally correct planarity of the lead 40 positions. An adjustable depth of focus is preferably used which should be on the order of approximately 20 mils. If the lead 40 is at precisely the right height or coplanarity level, it will block both beam 70A and beam 70B simultaneously. If the lead 407 is too low, it will break beam 70A and then beam 70B. If the lead 406 is too high, it blocks beam 70B and then beam 70A. Using the data referenced to as signal A and signal B, obtained from the detectors 74A, 74B, respectively, and the lead edge 404 positions, its lateral position can be determined by the sum of the signal A and signal B location divided by two, where each signal is defined to be the position where the system detects the lead 40 to be. The lead 40 height is equal to a constant times the difference between signal A and signal B, where the constant is determined by the angle $\alpha$ and $\beta$ between the beams 70A, 70B. A low lead 407 position is diagrammed in FIG. 6a.

Expressed mathematically, the leading edge 404 of each lead 40 will interrupt beam 70A when the part is at detected position (a) and beam 70A will again be detected by its associated detector 74A when it is at detected position (a'). Similarly, the leading edge 404 of the lead 40 will interrupt beam 70B when the part is at detected position (b) and the trailing edge 405 will be detected at position (b').

$$\text{Leading edge 404 position} = \frac{a + b}{2} \quad \text{[Eq. 1]}$$

$$\text{Trailing edge 405 position} = \frac{a' + b'}{2} \quad \text{[Eq. 2]}$$

$$\text{Edge height} = \frac{1}{2}\left[\frac{a}{\tan \alpha} - \frac{b}{\tan \beta}\right] \quad \text{[Eq. 3]}$$

$$\text{For } \alpha = \beta, \text{ height} = \frac{a - b}{2 \tan \alpha} \quad \text{[Eq. 4]}$$

Those skilled in the art will recognize that a number of alternative computations are possible with the system of the present invention. Available memory associated with the processor contains a component library specifying lead width and spacing for all components to be sensed and analyzed by the sensor 50. It will be possible to detect and analyze only the leading edge data (a) and (b) as represented in Equations 1, 3 and 4 and use the component library generate the centerline and proper placement of each lead. For more precise measurement, trailing edge data such as Equation 2 can be utilized for both lateral position and height analysis. Using both leading edge 404 and trailing edge 405 measurements it can also be determined whether the individual edges 404, 405 have coplanarity, that is whether any component lead 40 is not only bent but also twisted. Detecting both edges, 404, 405 also permits the system to sense and calculate the actual width of each component lead 40.

Although not illustrated in FIG. 6, or subsequent Figures, it also will be obvious to those skilled in the art that multiple beam systems need not physically intersect. It is possible to displace them, one from the other with a known offset, to be sure that light from laser beam A has no chance of scattering into detector B. Another method of ensuring that there is no interference between the beams is to use two different wavelengths of light with appropriate optical bandpass filters interposed before the detectors allowing only light from one source to be detected. Other expedients such as baffles (not shown) are also possible between the beams 70A, 70B, 70C.

There are inherent limitations in using two beams as depicted in FIG. 6a. Since the lead has thickness, and the height calculation for the lead will be based on the center of the lead, the calculated width will be wider than the actual width. It would be more desirable to calculate the height and width of each lead from the bottom of the lead using a vertical beam. To do this a sensor with three beams, one of which is oriented vertically and the other two separated by an equal angular distance to either side of the vertical beam can be used.

Illustrated in FIG. 7 is a three beam system 50 similar to the embodiment discussed in connection with FIG. 6. This sensor is more accurate in measuring the lead position and height for leads with non-rectangular (irregular) cross sections. It is particularly well suited for leads 40 utilized in tape automated bonding and stamped leads. For tape automated bonding, TAB leads are constructed from a thin unitary lead material, such as copper. The metalization is usually only from one to a few mils thick. A photoresist is applied to the surface and exposed to light. When exposed to light, the photoresist chemically etches through the metal to create the leads 40. The etch rate may be such that the lead 40 is not formed with substantially vertical walls. Rather, the walls take on a scalloped shape, such as shown in FIG.

7a, with the lead 40 cross-section assuming a substantially trapezoidal shape.

Since TAB automated bonding normally has the most minimal pitch, on the order of 4 mils, high measurement accuracy is necessary and the shape of the lead 40 can introduce error in the resolution accuracy.

Consequently, the three beam system 50 illustrated in FIG. 7 specifically detects the bottom surface 401 of the lead 40 because that is what is connected to the circuit board 28. To accurately define each edge 404, 405 of the bottom 401 of the TAB lead 40, the data from the detectors 74A, 74B which sense beams 70A and 70B can be used to detect the right side or leading edge 404 of the bottom surface 401 of lead 40 and the lead 40 height as shown in FIG. 7c. Data from the detectors 74A, 74B which sense beams 70B and 70C can be utilized to detect the left side or trailing edge 405 of the bottom surface 401 of the lead and lead height as shown in FIG. 7d. The detected heights can then be averaged. Using this process, only the bottom surface 401 of the lead 40 is used to detect the lateral position of the lead 40 and to calculate the height measurement. Of course, it is the bottom 401 of the lead 40 which is soldered to the circuit board 28. As with the two beam system, an included angle $\alpha + \beta$ of between 40-60 degrees is preferred.

Figure 8A:
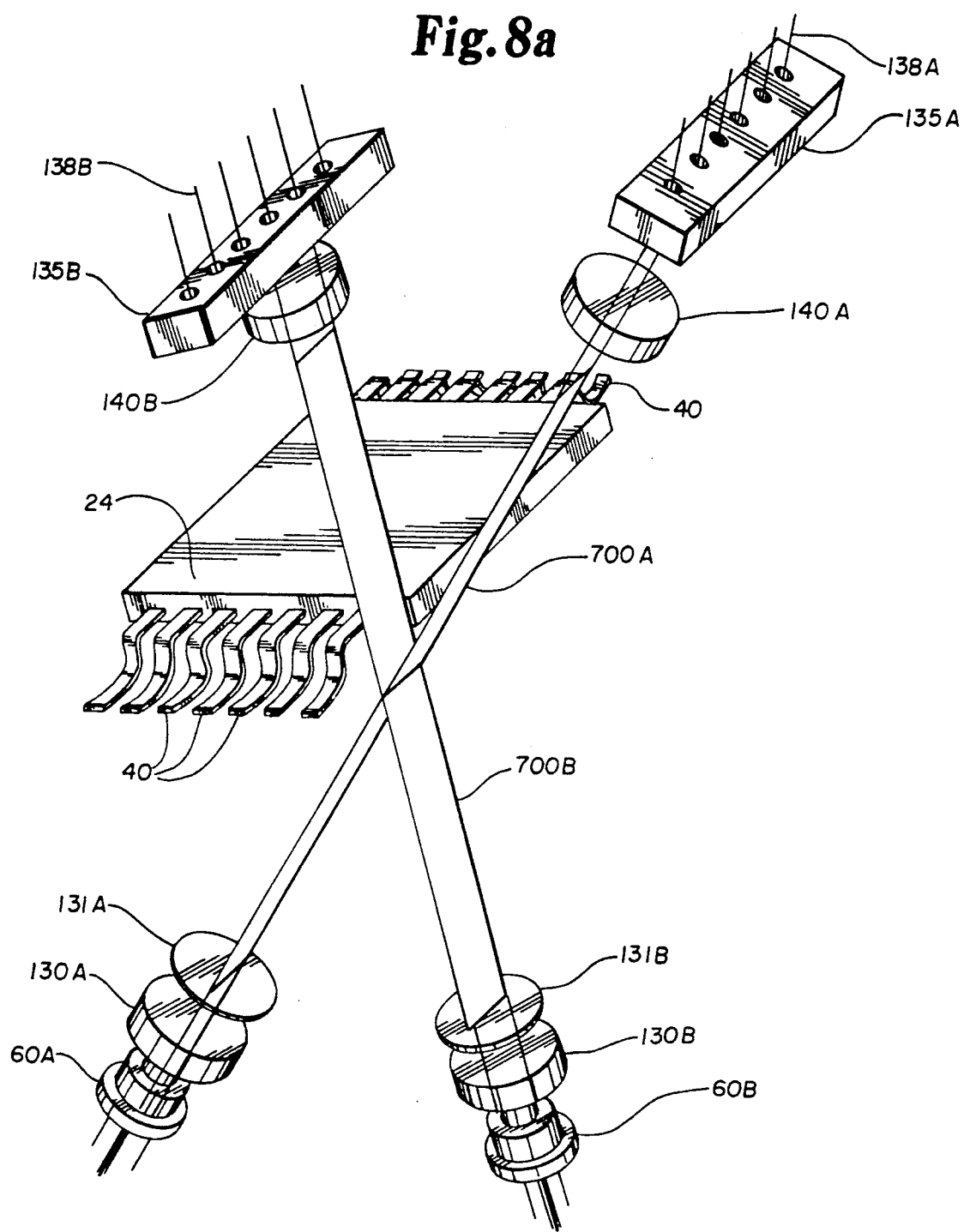
FIG. 8, consisting of FIGS. 8a-8d, illustrates a use of the invention to locate the lowest surface of each lead in this embodiment. Two stripes or sheets of laser light are used.

A more complex system is illustrated in FIG. 8. The embodiment of FIG. 8 assures the highest degree of coplanarity. In the previous embodiments 50 discussed, the primary objective is to determine the existence of one or more bent leads 40 which are bent in the lateral or vertical plane because of having been bumped into or brushed against something. A limitation of the height-measuring method for the most accurate sensing is that the focus of the laser beam 70 is approximately 1 mil or 25 microns wide and it might not be focused upon nor measure the lowest point 408 on each lead 40. When the tips 409 of the leads 40 are created, they are sheared or cut with a die. Therefore, the tips 409 begin to roll up with the die as they are punched to cut them off. As a consequence, as illustrated in FIGS. 8b and 8c, the tips 409 of the leads 40 can be rolled up slightly at the edge and can be tilted up to 10 degrees. In order to precisely define the lowest point 408 of the lead 40, which is that surface which will first come into contact with the solder paste and pad, this surface can be determined precisely with an embodiment similar to those discussed previously.

Rather than a single focused beam 70 of light, a stripe 700 of laser light is created from the single laser light source 60 with a source lens 130 and stripe projecting optical element 131. It should be understood that the source lens 130 and stripe projecting optical element 131 may be combined to form a single optical element. As discussed previously, two opposing sheets of laser light 700A, 700B are preferably used to calculate the height of the first detected lowest point 408 on the IC lead 40. Rather than a single detector 74, the detecting element is preferably a linear array 135 having 50-100 elements. To assure proper processing speed, individual or parallel outputs 138 are preferred from the detector array 135 and the lowest point 408 on the lead 40 is determined to be detected at such time as the first detector element 135 detects the shadow of the lead 40 which will occur as soon as the lowest point 408 of the leading edge of the shadow is detected, as illustrated in FIG. 8d. As the lowest point 408 of the lead 40 intersects each sheet of light 700A, 700B, the same processing algorithms that were discussed previously can be utilized to determine lateral lead position and precise coplanarity. If detectors 135A, 135B with a one mil pitch and parallel readout are not available, imaging optics 140A, 140B can be used to image the stripe 700A, 700B onto the larger detector array 135A, 135B.

Shown in FIG. 9 is a secondary laser sensor 50' of substantially similar design to that shown and discussed in connection with FIGS. 2 and 3, which can be advantageously used with the present invention 50 to more precisely locate the placement head 30 of the component placement machine and thus more precisely identify lead 40 locations with the highest degree of accuracy and resolution.

Some additional problems can occur as higher resolution is achieved in sensing and finer-pitch components 24 are built. Component placement machines from the encoder 99, the rail frame 32 upon which the placement head 30 is carried, the placement head 30 and vacuum quill 36 have a finite stiffness. That is, they are not infinitely stiff. The associated quill position encoder 99 monitors relatively accurately the position of the placement head 30 and vacuum quill 32 in a static sense so that the head 30 can be precisely located by reading the encoder 99. In the dynamic sense, more of a problem exists, particularly when the placement head 30 is being accelerated and during travel this becomes more important as the pitch becomes very, very fine. Since it is an object of the present sensor 50 to measure where the part 24 and the part leads 40 are relative to the quill 34, precise resolution on the order of 1 micron requires a precise location of the placement head 30 and associated quill 34.

Precise location of the placement head 30 can be achieved with the use of a similar sensor 50' as shown in FIG. 9a, which is configured to sense an optical target 150 secured to the bottom of the placement head 30. As illustrated in FIGS. 9b and 9c, the optical target 150 preferably alternates transparent portions 152 and opaque portions 154 so that the processing mechanism 50' can detect the position of the placement head 30 with the sub-micron precision which characterizes the present invention. Shown in FIG. 9c is an alternative embodiment constructed so as not to interfere with movement of the placement head 30. For purposes of the configuration of the embodiment of FIG. 9c, the optical target 150 can be preferably constructed of chrome 154 on glass 152 so that the reflection of the laser beam 70' from the reflective chrome surface 154 can be detected by the detector 74' for highly accurate determination of the placement head 30 and the associated quill 34, component 24 and component leads 40.

Figure 10A:
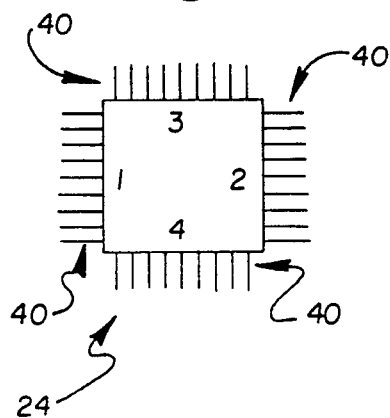
FIG. 10a is a representation of a four-sided semiconductor chip such as a quad pack integrated circuit.
Figure 10B:
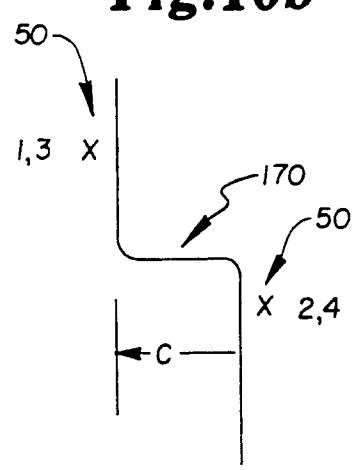
FIGS. 10b and 10c illustrate paths of the component placement head when using a plurality of sensors constructed in accordance with the present invention.
Figure 10C:
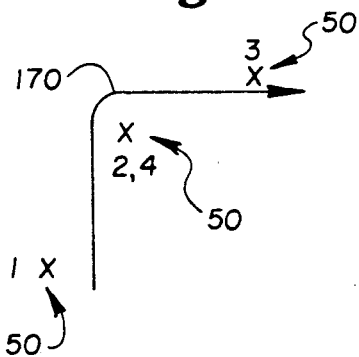

Using any of the various embodiments of the invention which have been described previously, highly accurate and precise location of the lateral displacement and height of the various leads 40 on an IC or other semiconductor device 24 can be determined. Referring to FIG. 10, in a component placement machine, a single sensor 50 can be used wherein all four sets 1-4 of leads 40 can be sequentially checked and determined. Since the component 24 must be stopped and passed through the sensor 50 four times, this, of course, is the most time consuming procedure. Similarly, two sensors 50 can be used where the component 24 is passed through the sensor 50 to check a first set of leads, side two as shown in FIG. 10b, and the component 24 jogged along the path 170 shown in FIG. 10b through the use of the placement head 30 a specified distance (c) depending on the component library to read the opposing set of leads 40, side one as shown in FIG. 9a. The component 24 can then be rotated 90 degrees and passed back through the two sensor system 50 to check the leads 40 on sides three and four as shown in FIG. 9a. Similarly, a three sensor system 50 can be used as shown in FIG. 10c, wherein a first sensor 50 checks the set of leads 40 on side one and a second sensor 50 checks the leads 40 on side two, following which the placement head 30 performs a 90-degree change in direction permitting the second sensor 50 to check the leads 40 on side four and third sensor 50 to check the leads 40 on side three. It is obvious that four independent sensors can also be utilized. For carousel or turret placement systems, it would be possible to have one or more sensing systems 50 housed at one or more stations. For high speed cartesian placement systems, it is possible to house one or more laser sensors in the same housing or enclosure with a 4 to 6 inch separation to accommodate maximum part 24 sizes.

A basic laser sensor which can detect bent leads 40 on an integrated circuit chip 24 with a resolution of less than 1 micron has been disclosed in conjunction with FIG. 2. Various alternative embodiments using the basic laser sensor 50 as a building block have been shown and discussed, which, when combined, can provide precise horizontal and vertical placement of the lowest surface of the leads 40 of a semiconductor device to a horizontal and vertical resolution on the order of less than one micron thereby allowing the part to be placed substantially within the accuracy and resolution of the component placement machine. While a number of alternative embodiments have been disclosed, it will be obvious to those skilled in the art that other modifications and variations are possible. Within the teaching of the present invention, each of such modifications and variations are within the intention of the invention as described by the following claims.

Having described our invention, we claim:

1. A sensor for determining the position of each element of a multiple element device of the type having each of its elements nominally disposed in a single plane, the sensor comprising:
   means for providing light, comprising:
      two laser diodes each emitting a laser beam of light, each laser beam being angled relative to the other;
   means for focusing the light in the plane of the elements, comprising:
      a focusing lens interposed in each laser beam, each focusing lens positioned to focus the laser beam in the nominal plane of the elements;
   two detecting means, wherein at least one of the detecting means detects the shadow of at least one edge of each element when it occludes the focused light, comprising:
      two single detectors, each detector interposed to receive the light emitted from one of the laser diodes;
   means for receiving data indicating the instantaneous lateral position of the edge of each element as the edge is detected by the detecting means; and
   logic means, connected to both detecting means and to the means for receiving data, for computing the lateral position of each element and the deviation of the lateral position of each element from its nominal position and for calculating the actual position of each element of the multiple element device.

2. A sensor for determining the position of each element of a multiple element device of the type having each of its elements nominally disposed in a single plane, the sensor comprising:
   means for providing light, comprising:
      two laser diodes each emitting a laser beam of light, each laser beam being angled relative to the other;
   means for focusing the light in the plane of the elements comprising:
      a focusing lens interposed in each laser beam, each focusing lens positioned to focus the laser beam in the nominal plane of the elements;
   at least one detecting means, for detecting the shadow of at least one edge of each element when it occludes the focused light, comprising:
      a plurality of single detectors, each detector interposed to receive the light emitted from one laser diode;
   means for receiving data indicating the instantaneous lateral position of the edge of each element as the edge is detected by the detecting means; and
   logic means, connected to the detecting means and to the means for receiving data, for calculating the actual position of each element of the multiple element device and for computing the coplanarity of the elements of the multiple element device based upon the detected position of each element when it passes through each of the laser beams.

3. A sensor for determining the position of each element of a multiple element device of the type having each of its elements nominally disposed in a single plane, the sensor comprising:
   means for providing light, comprising:
      at least three laser light sources wherein at least one of the laser light sources is in a vertical orientation relative to the elements of the multiple element device and each of the other laser light sources are angled relative to the vertical laser beam and relative to each other;
   means for focusing the light in the plane of the elements;
   at least one detecting means for detecting the shadow of at least one edge of each element when it occludes the focused light;
   means for receiving data indicating the instantaneous lateral position of the edge of each element as the edge is detected by the detecting means; and
   logic means, connected to the detecting means and to the means for receiving data, for calculating the actual position of each element of the multiple element device.

4. The sensor of claim 3 wherein one of the angled laser beams is angled away from the leading edge of each of said elements and the other angled laser beam is angled away from the trailing edge of each of the elements.

5. The sensor of claim 4 wherein the vertical laser beam and the laser beam which is angled away from the leading edges of each element are utilized to compute the lateral position of the leading edge of each element and wherein the vertical laser beam and the laser beam which is angled away from the trailing edges of the elements are used to compute the lateral position of the trailing edges of each of the elements whereby the lateral position of each element is computed based solely on the lateral position of the lower surface of each element.

6. The sensor of claim 4 wherein the laser beam which is angled away from the leading edges of each element and the vertical laser beam are utilized to compute the height of the leading edge of each element and wherein the laser beam which is angled away from the trailing edges of the elements and the vertical beam are used to compute the height of the trailing edges of each of the elements whereby the height of each element is computed based solely on the height of the lower surface of each element.

7. The sensor of any of claims 1, 2, 3 or 5 for use with a system for positioning the multiple element device, wherein the logic means comprises:
  means for determining an optimum multiple element device location by analyzing said actual positions of each element of the multiple element device; and
  means for generating a positioning signal.

8. A sensor for determining the position of each element of a multiple element device having each of its elements nominally disposed in a single plane, the sensor comprising:
  means for providing light, comprising:
    two laser diodes each directed toward the nominal plane of the elements but angled relative to each other;
  means for focusing the light in the plane of the elements comprising at least one lens associated with each laser light source to provide a stripe of light from each laser diode;
  detecting means, for detecting the shadow of at least one edge of each element when it occludes the focused light, comprising:
    two linear arrays each oriented to receive one of the stripes of laser light along its length;
  means for receiving data indicating the instantaneous lateral position of the edge of each element as the edge is detected by the detecting means; and
  logic means, connected to the detecting means and to the means for receiving data, for calculating the actual position of each element of the multiple element device, comprising means for determining when the shadow falls on at least one detector element of the linear arrays and for calculating the height of the lowest surface of each element of the multiple element device based on the position at which the lowest point on the surface of the element is detected by the detecting means.

9. The sensor of any of claims 1, 2, 3 or 8 wherein the sensor further comprises reflecting means, for reflecting and directing light, interposed between the light providing means and its associated detecting means whereby each detecting means can be located at a remote position relative to the light providing means.

10. The sensor of any of claims 1, 2, 3 or 8 further comprising means for reflecting and directing light from the means for providing light to the multiple element device.

11. The sensor of any of claims 1, 2, 3, 5, 6 or 8 wherein the logic means comprises means for generating a rejection signal when elements are determined to be positioned outside of predetermined tolerances.

12. The sensor of any of claims 1, 3 or 8, wherein:
  each laser light source further comprises adjustable means for providing light at a single wavelength so that each laser beam can provide light at a different wavelength; and
  the detecting means comprises means for differentiating between light of different wavelengths.

13. The sensor of any of claims 2, 6 or 8 wherein the sensor further comprises means for adjusting the diameter of the focal point of each focused laser beam.

14. The sensor of any of claims 2, 6 or 8 wherein the sensor further comprises means for adjusting the depth of focus of each focused laser beam.

15. The sensor of any of claims 1, 2, or 8 wherein the light providing means comprises at least one laser diode and the light providing means further comprises a means to precisely control the output power of at least one laser diode.

16. The sensor of any of claims 1, 2, 3 or 8 wherein the position of each element of a multiple element device is determined when the multiple element device is stationary and the sensor is in motion.

17. The sensor of any of claims 1, 2, 3 or 8 wherein the position of each element of a multiple element device is determined when the sensor and multiple element device are simultaneously in motion.

18. A laser-based sensor for determining the lateral position of each lead on a multiple lead integrated circuit device having each lead nominally disposed in a single lateral plane, wherein the multiple lead integrated circuit device is transported by a quill through the sensor, the sensor comprising:
  a single laser light source;
  a focusing lens interposed in the laser beam from the laser light source for focusing the laser beam in the nominal plane of the leads;
  a single detector means for detecting the shadow of the leading edge of each lead when it enters the focal point of the laser light beam and for detecting the shadow of the trailing edge of each lead when it exits the focal point of the laser light beam comprising:
    a light sensitive means for providing a voltage output signal as a function of the amount of blockage of the laser beam;
    threshold reference means for providing a stepped reference voltage signal;
    a comparator means for comparing the voltage output signal to the stepped reference voltage signal and generating a digital output signal of beam blockage whereby data on the leading and trailing shadow edges of each lead is encoded when the digital output signal changes state;
  encoder means for tracking the position of the quill;
  means for receiving the position of the quill at all times; and
  logic means, connected to the detecting means and to the means for receiving the position of the quill, for calculating the actual position of each lead and its deviation, if any, from its nominal position whereby the calculation of the actual position of the lead is based on coordination of the leading edge shadow data and the trailing edge shadow data encoded in the digital output signal with the position of the quill.

19. The sensor of claim 18 further comprising means for storing predicted lead width and spacing information for generating the nominal position of a lead.

20. The sensor of claim 18 wherein the logic means calculates the actual width of each lead.

21. A laser-based sensor system for determining the lateral position of a lead on a multiple lead semiconductor device having each of its leads disposed in a single horizontal plane, the sensor system comprising:
  at least two laser light sources;

each laser light source configured to direct a laser beam in the direction of the leads of the component, at least one of the laser beams being directed at an angle relative to the other;

a focusing means associated with each laser beam, the focusing means being spaced from the laser light source to create a nominal focal point at or about the plane of the leads;

a single detector means associated with each laser beam;

a receiving means for receiving the lateral position of each lead; and a logic means connected to the detecting means and the receiving means for receiving data indicating the lateral position of each lead and for computing the lateral position of each lead based on the detected lateral position generated by the detecting means, said logic means further comprising processing means for computing the deviation of the detected position of the lead from its nominal position.

22. A laser-based sensor system for determining the coplanarity of the leads on a multiple lead semiconductor device having each of its leads nominally disposed in a single horizontal plane, the sensor system comprising:

at least two laser light sources;

each laser light source configured to direct a laser beam in the direction of the leads of the component, at least one of the laser beams being directed at an angle relative to the other;

a focusing means associated with each laser beam, the focusing means being spaced from the laser light source to create an adjustable focal point at or about the plane of the leads;

a single detector means associated with each laser beam;

a receiving means for receiving data indicating the lateral position of each lead; and logic means connected to the detecting means and the receiving means for receiving the lateral position of each lead as it enters each laser beam and for computing the height of each lead based on the angle of the laser beams and the detected lateral position generated by the detecting means, said logic means further comprising processing means for computing the deviation of the detected height of each lead from the nominal plane of the leads.

23. A laser-based sensor for determining the lateral position and coplanarity of the bottom surface of the leads on a multiple lead integrated circuit device, each lead being nominally disposed in a single lateral plane, the sensor comprising:

three laser light sources each emitting a beam of laser light, each of the laser light sources being located away from the plane of the leads and each laser beam having a focal point which is focused at the plane of the leads, one laser beam being oriented in a generally vertical direction, one of said laser beams being angled toward the leading edge of the component lead and the other of said laser beams being angled toward the trailing edge of the component lead;

detector means associated with each laser beam for detecting when each laser beam is occluded by the component lead;

recorder means for receiving data relating to the instantaneous lateral position of each lead; and logic means connected to the detecting means and the recorder means for calculating the coplanarity of the bottom surface of the component leads, said logic means comprising means for selectively processing the data from the vertical laser beam and from the laser beam directed away from the leading edge of the component lead for purposes of computing the position and height of the leading edge of the component and for selectively processing data from the vertical laser beam and the laser beam directed away from the trailing edge of the component lead for determining the lateral position and height of the trailing edge of the component lead whereby the lowest surface of the component lead is analyzed for purposes of lateral position and coplanarity.

24. A laser-based sensor system for determining the lateral position and co-planarity of the lowest surfaces of the leads on a semiconductor component having multiple leads, each lead being disposed generally in a horizontal plane, the sensor comprising:

two laser light sources, each directed toward the plane of the component leads;

means for generating a stripe of laser light from each laser light source;

individual detector means positioned to receive each stripe of laser light, each of said detector means comprising a linear array oriented to receive the stripe of laser light along its length;

output means for selectively detecting the first occurrence of shadow cast by each component lead as it passes through the stripe of laser light; and means for computing the lateral position of each component lead and the coplanarity of the component leads based on the first detected shadow cast by the component lead as detected by each of the detector means.

25. A two sensor system for determining the lateral position of each lead on a multiple lead component carried by a placement head on a component placement machine using the instantaneous position of the placement head, the two sensor system comprising:

a first laser based sensor for determining the instantaneous position of the placement head comprising:

an optical target fixed to the lowest surface of the placement head having precisely spaced detectable elements;

a laser light source emitting a laser beam of light directed toward the optical target;

a light detector, interposed in the path of the laser beam with the optical target positioned between the laser light source and the detector, for detecting each element on the optical target; and output means for indicating the detection of each element on the optical target so that the instantaneous position of the placement head can be determined; and a second laser based sensor for detecting leads on a multiple lead component comprising:

position input means, connected to the output means, for receiving the position data from the output means;

lead detection means for detecting each lead on the multiple lead component, comprising:

at least two lead detection laser light sources;

each lead detection laser light source configured to direct a laser beam in the direction of the leads of the component, at least one of the laser beams being directed at an angle relative to the other;

a focusing means associated with each laser beam, the focusing means interposed between the lead detection laser light source and the component to create a nominal focal point at or about the plane of the leads; and at least two lead detectors, each lead detector interposed to receive laser light emitted from one of the lead detection laser light sources; and logic means, connected to the position input means and the lead detection means, for computing the lateral position of each lead on the multiple lead component using the position data of the output means.

26. The two sensor system of claim 25 wherein the detectable elements are opaque and wherein at least one edge of each element is detected when it occludes laser light and casts a shadow on the detector means.

27. The two sensor system of claim 25 wherein the detectable elements are reflective and wherein at least one edge of each element is detected when it reflects laser light onto the detector means.

28. A method for precisely placing a component with multiple leads carried by a surface mount component placement machine wherein the leads have a nominal lateral position, the method comprising:

generating at least two light beams from at least one light source with at least one light beam being angled relative to an other;

focusing the light from each of the light sources in the plane of the leads;

passing each of the leads through the focal point of the focused light beams;

detecting with a light detector associated with each focused light beam at least one edge of each lead when it occludes the focused light beam;

receiving data indicating the instantaneous lateral position of the edge of each lead as the edge is detected by the light detector;

calculating the lateral position of each lead using the data indicating the instantaneous lateral position;

calculating the deviation of each lead from its nominal position;

sorting the deviations to determine the maximum positive deviation and the maximum negative deviation; and computing the optimum component location based upon the lateral position of each of the leads for placement of the component on a surface mount circuit board by the surface mount component placement machine.

29. A method of analyzing the leads on a component with multiple leads, the leads being nominally disposed in a single plane, the method comprising:

generating light beams from at least two light sources at least one light beam being angled relative to the other;

focusing the light from each of the light sources in the nominal plane of the leads;

passing each of the leads through the focal point of the focused light beams;

detecting with light detecting means associated with each focused light beam the lateral position at which at least one edge of each lead occludes each light source;

calculating the height of each lead based on the lateral position that each lead occludes the light source and the relative angle of each light beam; and computing the coplanarity of each of the leads relative to the other leads on the multiple lead device.

30. A method of determining the lateral position and coplanarity of the lower surfaces of leads on a multiple lead device, the method comprising:

generating three laser light beams, at least one of which has a vertical orientation and the other two being angled relative to the vertically oriented laser beam and relative to each other;

focusing each laser beam in the plane of the leads on the multiple lead device;

detecting the leading edge of the lower surface of each lead using the vertical light beam and one of the angled light beams;

detecting the trailing edge of each lead utilizing the vertical light beam and the other of the laser beams; and computing the lateral position of each lead and the coplanarity of the leads on the multiple lead device.

31. The method of either claim 29 or 30 wherein the method further comprises the step of adjusting the depth of focus of each of the focused laser beams so that all leads on the multiple lead device pass through the focal point of the focused laser beam.

32. The method of either of claims 29 or 30 wherein the method further comprises calculating the greatest difference in height between any of the leads and the nominal plane of the leads and generating a rejection signal when the height difference exceeds a predetermined tolerance level.

33. The method of either of claims 28, 29, or 30 wherein the method further comprises calculating the deviation of each lead from its nominal position and generating a rejection signal when the total deviation between any two leads exceeds a predetermined tolerance level.

34. The method of either of claims 29 or 30 wherein the method further comprises determining the optimum multiple element device location and generating a repositioning signal.

35. A method for determining the position of each lead of a multiple lead integrated circuit device of the type having each of its leads nominally disposed in a single plane, wherein the multiple lead integrated circuit device is transported by a quill through a sensor, the method comprising:

sequentially focusing light generated by a laser on each lead of the multiple lead integrated circuit device;

detecting the leading edge of each lead caused by occlusion of focused light by the leading edge;

detecting the trailing edge of each lead caused by occlusion of focused light by the trailing edge;

generating a digital output signal of beam blockage whereby data on the leading and trailing edges of each lead is encoded by changing the state of the digital output signal;

determining position of the quill with an encoder;

receiving the position of the quill from the encoder; and calculating the actual position of each lead of the multiple lead integrated circuit device whereby the calculation of the actual position of the lead is based on the coordination of the digital output signal containing leading edge and trailing edge data with the position of the quill.

36. The method of claim 35, wherein the step of focusing light comprises focusing at least three laser beams positioned so that at least two beams intercept the lower surface of each lead and wherein the step of calculating the actual position of each lead comprises computing the lateral position and height of each lead based on the lateral position and height of the lower surface of each lead.

37. The method of claim 35 wherein the step of focusing light comprises focusing at least two light beams in the nominal plane of the leads and wherein the step of calculating the actual position of each lead further comprises computing the coplanarity of each lead relative to all of the other leads of the multiple lead integrated circuit device.

38. A method wherein a plurality of light sources and at least two light detectors are positioned to detect whether light has been occluded by a leading edge of an element of the multiple element device and wherein detecting the leading edge of each element comprises receiving data from at least two light detectors for determining the position of each element of a multiple element device of the type having each of its elements nominally disposed in a single plane, the method comprising:
  sequentially focusing light generated by at least two lasers on each element of the multiple element device;
  detecting with at least two leading edge light detectors the leading edge of each element caused by occlusion of light by the leading edge;
  receiving data indicating the instantaneous lateral position of each element as it passes through the focused light; and
  calculating the actual position of each element of the multiple element device.

39. A method wherein a plurality of light sources and at least two light detectors are positioned to detect whether light has been occluded by a trailing edge of an element of a multiple element device and wherein detecting the trailing edge of each element comprises receiving data from at least two light detectors for determining the position of each element of a multiple element device of the type having each of its elements nominally disposed in a single plane, the method comprising:
  sequentially focusing light generated by at least two lasers on each element of the multiple element device;
  detecting with at least two trailing edge light detectors the trailing edge of each element caused by occlusion of light by the trailing edge;
  receiving data indicating the instantaneous lateral position of each element as it passes through the focused light; and
  calculating the actual position of each element of the multiple element device.

40. A method for determining the position of each element of a multiple element device of the type having each of its elements nominally disposed in a single plane, the method comprising:
  focusing at least two light beams from at least one light source in the plane of the elements;
  passing each element of the multiple element device through the focal point of the focused lights;
  detecting the occlusion of focused light by each element with a detector;
  determining the lateral position and height relative to the nominal plane of each element as it passes through the focused light;
  calculating the coplanarity of each element of the multiple element device relative to other elements of the multiple element device using the determined height.

41. The method of claim 40 wherein the step of focusing the light beams comprises focusing two or more stripes of laser light beams in the plane of the elements.

42. The method of claim 40 wherein the step of focusing light beams comprises focusing a plurality of laser light beams, each having a different wavelength.

43. The method of claim 40 wherein the multiple element device is an optical target and wherein the step of measuring the lateral position of each element comprises detecting the presence of light reflected from alternatively reflective and transparent parts on the optical target.

44. The method of claim 40 wherein the step of calculating the coplanarity of the elements of the multiple element device comprises computing and comparing the lateral position and height relative to the nominal plane of the lower surface of each element.

45. A method for determining the position of each element of a multiple element device of the type having each of its elements nominally disposed in a single plane, the method comprising:
  focusing at least two light beams from at least one light source in the plane of the elements;
  passing each element of the multiple element device through the focused light;
  detecting the lowest point on the surface of each element;
  receiving data on the lateral position of each element as it passes through the focused light;
  calculating the height relative to the nominal plane of the lowest surface of each element of the multiple element device based on the position at which the lowest point on the surface of the element is detected.

46. The method of claim 45 wherein the step of focusing light beams comprises focusing at least one stripe of laser light through the focal point of which each element is passed.

47. The method of claim 45 wherein the step of focusing light beams comprises focusing at least two stripes of laser light, each angled relative to the other, through the focal point of which each element is passed.

48. A method for determining the exact width of each lead of a multiple lead integrated circuit device having each of its leads nominally disposed in a single plane, wherein the multiple lead integrated circuit device is transported by a quill through a sensor, the method comprising:
  focusing a laser light to a focal point in the single plane where each of the leads of the multiple lead integrated circuit device are nominally disposed;
  sequentially creating shadows by occluding the focused laser light with each lead of the multiple lead integrated circuit device;
  determining position of the quill with an encoder;
  detecting the shadow created by the leading edge of each lead;
  receiving the position of the quill indicating the actual lateral position of each leading edge when the shadow created by the leading edge of each lead is detected;

detecting the end of the shadow created by the trailing edge of each lead;

receiving the position of the quill indicating the actual lateral position of each trailing edge when the shadow created by the trailing edge of each lead is detected;

generating a digital output signal of beam blockage whereby data on the leading and trailing edges of each lead is encoded by changing the state of the digital output signal;

coordinating the digital output signal with the quill position indicating the actual lateral position of each leading edge and the quill position indicating the actual lateral position of each trailing edge;

calculating the exact width of each lead.

49. A sensor for determining the position of each element of a multiple element device of the type having each of its elements nominally disposed in a single plane, the sensor comprising:

a means for providing light comprising:

two laser diodes each emitting a laser beam of light, each laser beam being angled relative to the other and intersecting in the nominal plane of the elements;

means for focusing the light in the plane of the elements, comprising:

a focusing lens interposed in each laser beam, each focusing lens positioned to focus the laser beam in the nominal plane of the elements;

detecting means for detecting the shadow of at least one edge of each element when it occludes the focused light, comprising:

single detectors, one detector interposed to receive light emitted from each laser diode;

means for receiving data indicating the instantaneous lateral position of the edge of each element as the edge is detected by the detecting means; and logic means, connected to the detecting means and to the means for receiving data, for calculating the coplanarity of the elements using the nominal plane of the elements in which the beams intersect as a reference.

* * * * *